United States Patent
Staszewski et al.

(10) Patent No.: US 9,094,184 B2
(45) Date of Patent: Jul. 28, 2015

(54) FIRST AND SECOND PHASE DETECTORS AND PHASE OFFSET ADDER PLL

(71) Applicant: Texas Instruments Incorporated, Dallas, TX (US)

(72) Inventors: Robert Bogdan Staszewski, Delft (NL); Dirk Leipold, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/525,965

(22) Filed: Oct. 28, 2014

(65) Prior Publication Data

US 2015/0043699 A1    Feb. 12, 2015

Related U.S. Application Data

(60) Division of application No. 13/710,722, filed on Dec. 11, 2012, now abandoned, which is a continuation of application No. 10/131,523, filed on Apr. 24, 2002, now Pat. No. 8,385,476.

(60) Provisional application No. 60/286,572, filed on Apr. 25, 2001.

(51) Int. Cl.
| | |
|---|---|
| *H03L 7/087* | (2006.01) |
| *H04L 7/033* | (2006.01) |
| *H03C 3/09* | (2006.01) |
| *H03K 19/00* | (2006.01) |
| *H03L 7/085* | (2006.01) |
| *H03L 7/091* | (2006.01) |
| *H03L 7/093* | (2006.01) |
| *H03L 7/099* | (2006.01) |
| *H03L 7/16* | (2006.01) |

(Continued)

(52) U.S. Cl.
CPC ............ *H04L 7/0331* (2013.01); *H03C 3/0966* (2013.01); *H03K 19/0016* (2013.01); *H03L 7/08* (2013.01); *H03L 7/085* (2013.01); *H03L 7/087* (2013.01); *H03L 7/091* (2013.01); *H03L 7/093* (2013.01); *H03L 7/099* (2013.01); *H03L 7/0991* (2013.01); *H03L 7/16* (2013.01); *H03L 2207/50* (2013.01); *H04L 7/0029* (2013.01)

(58) Field of Classification Search
CPC ......... H03L 2707/50; H03L 7/06; H03L 7/08; H03L 7/087; H03L 7/099; H03L 7/0991; H03L 7/085; H03L 7/0331
USPC .......... 375/373, 371, 375, 376; 327/105, 147, 327/156, 159
See application file for complete search history.

(56) References Cited

U.S. PATENT DOCUMENTS 3,336,534 A * 8/1967 Gluth ............................. 331/12
3,588,734 A * 6/1971 Weiti ............................... 331/2

(Continued)

*Primary Examiner* — Jean B Corrielus
(74) *Attorney, Agent, or Firm* — Lawrence J. Bassuk; Charles A. Brill; Frank D. Cimino (57) ABSTRACT

A phase locked loop circuit (30, 100, 110) includes a controllable oscillator (42) for generating an output signal of desired frequency responsive to a control signal, a first phase detection circuit (32, 102, 112) for generating an output indicative of phase differential responsive to the output signal and a first edge of a reference signal and a second phase detection circuit (34, 104, 114) for generating an output indicative of phase differential responsive to the output signal and a second edge of a reference signal. The control signal to the controllable oscillator (42) is driven by the outputs of the first and second phase detections circuits.

6 Claims, 7 Drawing Sheets

(51) Int. Cl.
  *H03L 7/08* (2006.01)
  *H04L 7/00* (2006.01)

(56) References Cited

U.S. PATENT DOCUMENTS

| | | | | |
|---|---|---|---|---|
| 3,792,478 A | * | 2/1974 | Parquier et al. | 342/368 |
| 3,924,197 A | * | 12/1975 | Okano et al. | 331/12 |
| 4,262,264 A | * | 4/1981 | Vandegraaf | 331/4 |
| 4,652,834 A | * | 3/1987 | McAdam | 329/311 |
| 4,758,879 A | * | 7/1988 | Matthies | 348/505 |
| 4,901,026 A | * | 2/1990 | Phillips et al. | 327/10 |
| 5,614,845 A | * | 3/1997 | Masleid | 326/93 |
| 5,757,216 A | * | 5/1998 | Murata | 327/156 |
| 5,907,253 A | * | 5/1999 | Davis et al. | 327/156 |
| 5,917,352 A | * | 6/1999 | Dunlap et al. | 327/158 |
| 6,208,181 B1 | * | 3/2001 | Johnson | 327/156 |
| 6,242,955 B1 | * | 6/2001 | Shen et al. | 327/158 |
| 6,366,146 B2 | * | 4/2002 | Fredriksson | 327/156 |
| 2001/0026179 A1 | * | 10/2001 | Saeki | 327/147 |

* cited by examiner

FIRST AND SECOND PHASE DETECTORS AND PHASE OFFSET ADDER PLL

CROSS-REFERENCE TO RELATED APPLICATIONS

This application is a Divisional of application Ser. No. 13/710,722, filed Dec. 11, 2012, now abandoned;

Which is a Continuation of application Ser. No. 10/131,523, filed Apr. 24, 2002, now U.S. Pat. No. 8,385,476, granted Feb. 26, 2013;

Which claims the benefit of the filing date of provisional application U.S. Ser. No. 60/286,572, filed Apr. 25, 2001, entitled "Frequency Synthesizer Architecture of the Digital Radio Processor (v2.0)" to Staszewski et al.

STATEMENT OF FEDERALLY SPONSORED RESEARCH OR DEVELOPMENT

Not Applicable

BACKGROUND OF THE INVENTION

1. Technical Field

This invention relates in general to electronics and, more particularly, to a digital phase locked loop.

2. Description of the Related Art

A great reduction of the transistor features in recently developed deep-submicron CMOS processes shifts the design paradigm towards more digitally-intensive techniques. In a monolithic implementation, the manufacturing cost of a design is measured not in terms of a number of devices used but rather in terms of the occupied silicon area, no matter what the actual circuit complexity.

Analog and RF circuits used in communication circuits, however, are not easily implemented in a deep-submicron CMOS process. For example, in Texas Instruments' CMOS process (CO35) of 0.08 m L-effective features a digital gate density of 150K equivalent (2-input NAND) gates per $mm^2$. An average-size inductor for an integrated LC oscillator occupies about 0.5 $mm^2$ of silicon area. A low-noise charge pump, or a low-distortion image-reject modulator, both good examples of classical RF transceiver components, occupy roughly about the same area, which could be traded for tens of thousands of digital gates.

Migrating to a digitally-intensive synthesizer architecture brings forth the following well-known advantages: (1) fast design turn-around cycle using automated CAD tools (VHDL or Verilog hardware-level description language, synthesis, auto-place and auto-route with timing-driven algorithms, parasitic backannotation and postlayout optimization), (2) much lower parameter variability than with analog circuits, (3) ease of testability, (4) lower silicon area and dissipated power that gets better with each CMOS technology advancement (also called a "process node") and (5) excellent chances of first-time silicon success. Commercial analog circuits usually require several design iterations to meet marketing requirements.

There is a wide array of opportunities that integration presents. The most straightforward way would be to merge various digital sections into a single silicon die, such as DRAM or Flash memory embedded into DSP or controller. More difficult would be integrating the analog baseband with the digital baseband. Care must be taken here to avoid coupling of digital noise into the high-precision analog section. In addition, the low amount of voltage headroom challenges one to find new circuit and architecture solutions. Integrating the analog baseband into RF transceiver section presents a different set of challenges: the conventional Bi-CMOS RF process is tuned for high-speed operation with a number of available passive components and does not fundamentally stress high precision.

Sensible integration of diverse sections results in a number of advantages: (1) lower total silicon area—in a deep-submicron CMOS design, the silicon area is often bond-pad limited; consequently, it is beneficial to merge various functions on a single silicon die to maximize the core to bond-pad ratio, (2) lower component count and thus lower packaging cost, (3) power reduction—no need to drive large external inter-chip connections and (4) lower printed-circuit board (PCB) area, thus saving the precious "real estate."

Deep-submicron CMOS processes present new integration opportunities on one hand, but make it extremely difficult to implement traditional analog circuits, on the other. One such problem involves the design of a digital phase locked loop (DPLL). A PLL loop is a fixed-point phase domain architecture whose purpose is to generate a stable RF signal at a desired frequency. The underlying frequency stability of the system is derived from a reference clock generated by a crystal oscillator, such as a temperature-compensated crystal oscillator (TCXO) used in mobile phones. Phase information between the output signal and the reference signal is used to update a controllable oscillator. This information is generated at an active edge of the reference clock. However, greater accuracy could be obtained by more frequent determinations of the phase information, leading to more frequent updates of the controllable oscillator.

Therefore, a need has arisen for a method and apparatus for a phase locked loop design that provides for increase accuracy in the output signal.

BRIEF SUMMARY OF THE INVENTION

In a first aspect of the present invention, a phase locked loop circuit includes a controllable oscillator for generating an output signal of desired frequency, a first phase detection circuit for generating an output indicative of phase differential responsive to the output signal and a first edge of a reference signal and a second phase detection circuit for generating an output indicative of phase differential responsive to the output signal and a second edge of a reference signal. The controllable oscillator is driven responsive to the outputs of the first and second phase detections circuits.

This aspect of the invention increases the timing updates for the phase-locked loop since both edges of the reference clock are used for phase detection.

In a second aspect of the present invention, a mobile communication device comprises a frequency synthesizer for generating a carrier frequency output responsive to a local reference clock, circuitry for generating multiple clock signals of different frequencies synchronous to the carrier frequency output and digital baseband circuitry operating responsive to one or more of the multiple clock signals.

This aspect of the present invention allows for a plurality of clocks to be derived from the output of a frequency synthesizer. By reducing the number of phase-locked loop circuits use to generate clocks, unnecessary circuitry can be eliminated. Further, by providing a number of clocks synchronous to the RF carrier frequency, spurious noise throughout the mobile communication device can be controlled to reduce the effect on communications. An additional benefit is that complex circuitry for synchronizing the local reference signal to a master clock signal can be eliminated, and the carrier frequency can be synchronized to the master clock through minor adjustments to a phase error signal.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 1b illustrates a timing diagram showing the operation of the circuit of FIG. 1a;

FIG. 3b illustrates a timing diagram showing the operation of the phase locked loop circuit of FIG. 3a;

FIG. 4b illustrates a timing diagram showing the operation of the ADPLL of FIG. 4a;

DETAILED DESCRIPTION OF THE INVENTION

The present invention is best understood in relation to FIGS. 1-13 of the drawings, like numerals being used for like elements of the various drawings.

Figure 1A:
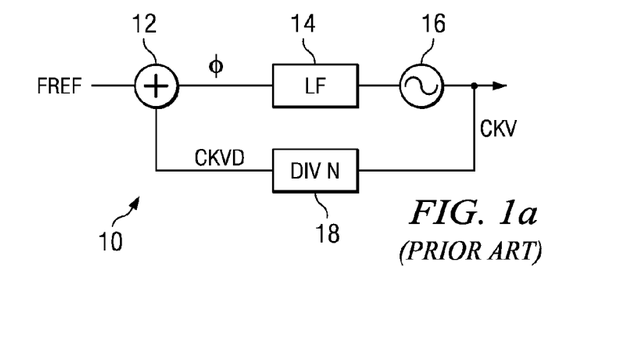
FIG. 1a illustrates a block diagram of a prior art phase locked loop circuit.

FIG. 1a illustrates a block diagram of a generalized phase locked loop device (PLL) 10. A reference frequency FREF, typically generated by a crystal oscillator, is input to a phase detector 12 along with CKVD, the divided-down clock output of the PLL 10. An error signal, 4, is passed to a loop filter 14. The filtered signal adjusts the output of a controllable oscillator 16. The output of the controllable oscillator 16, CKV, is fed back to the phase detector 12 through a frequency divider 18.

In general, the phase detector (and, hence, the controllable oscillator) operates responsive to an active edge of the FREF signal. For purposes of illustration throughout this specification, it will be assumed that the rising edge of FREF is the active edge; alternatively, the falling edge could be used as the active edge of FREF.

In many situations, it would be beneficial to compare the phases and update the output signal more often. One possible solution would be to clock the phase detector and controllable oscillator at both the rising and falling edges of FREF.

Figure 1B:
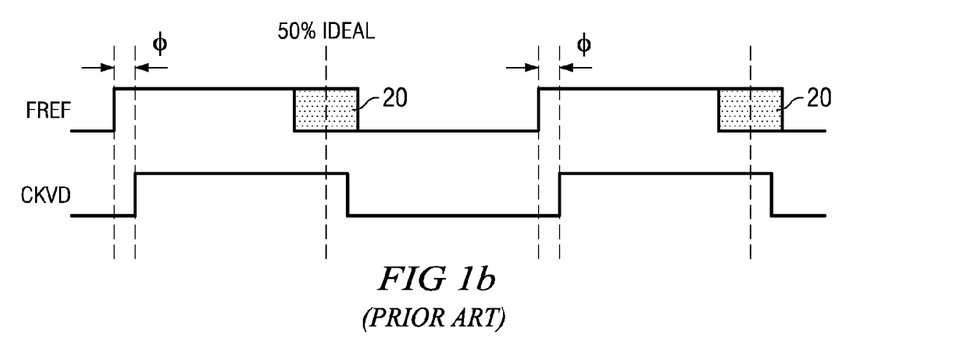

As shown in FIG. 1b, however, clocking on both edges of the reference signal presents a problem. While the output of a crystal oscillator produces a signal with a fairly accurate 50% duty cycle (i.e., the time between a rising edge and the subsequent falling edge is exactly the same as the time between a falling edge and a subsequent rising edge), intervening circuitry can affect the duty cycle, such that the falling edge may occur within a range 20 in FIG. 1b. Consequently, the falling edge of FREF cannot be used as a mid-point between rising edges of FREF.

Figure 2:
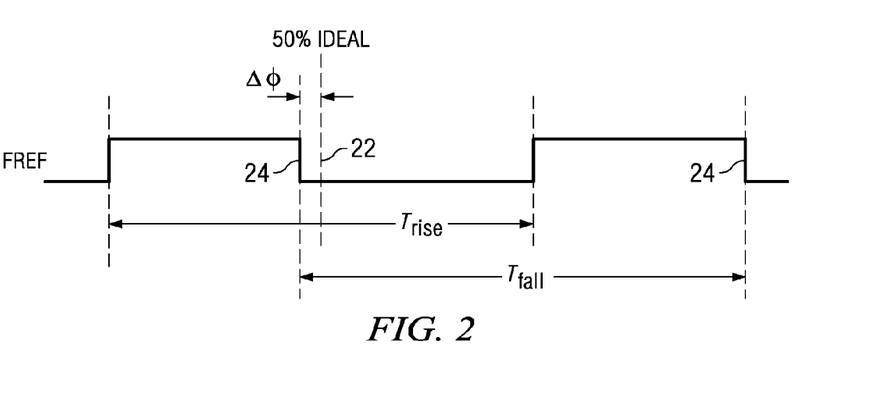
FIG. 2 illustrates a timing diagram showing relationships between the rising and falling edges of a reference clock.

As shown in FIG. 2, the present invention uses a property of FREF to gain useful information from the falling edge of FREF. In FIG. 2, dashed line 22 shows the ideal 50% duty cycle mark for the falling edge. While the actual falling edge, shown at line 24 may be offset from the ideal, the time period $T_{fall}$ between actual falling edges 24 equals the time period $T_{rise}$ between rising edges. Thus, for each cycle, the actual falling edge 24 will be offset from the ideal 22 by a constant $\Delta\phi$.

Figure 3A:
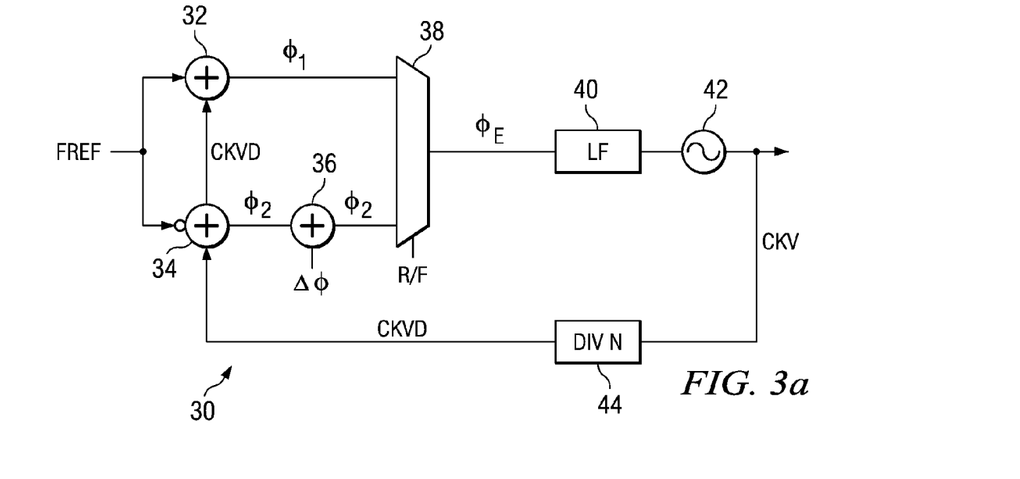
FIG. 3a illustrates a block diagram of a phase locked loop circuit capable of sampling on both edges of a reference clock.

FIG. 3a illustrates a first embodiment of the invention for using both edges of a reference clock in a PLL 30. FREF is input to a first phase detector 32 (which compares phase information on a first active edge, e.g. rising edge) of FREF and a second phase detector 34 (which compares phase information on a second active edge, e.g. falling edge) of FREF. Alternatively, the FREF signal is input to the first phase detector 32 and the inverted FREF signal is input to the second phase detector 34, and both phase detectors operate internally on the same active edge of the reference clock signals that are 180 degrees out of phase. The output of the first phase detector 32 is a first error signal $\phi_1$ and the output of the second phase detector 34 is a second intermediate error signal $\phi_2'$. The intermediate error signal $\phi_2'$ is added to $\Delta\phi$ through phase offset adder 36 to generate the second error signal $\phi_2$. The first and second error signals are input to multiplexer 38, which selects one of the first and second error signals responsive to an rising/falling (R/F) control signal, which indicates whether the current active edge of FREF is rising or falling. The output of multiplexer 38 is received by loop filter 40. The output of loop filter 40 drives oscillator 42. The output of oscillator 42 (CKV) is received by frequency divider 44. The divided output signal CKVD is transmitted to phase detectors 32 and 34.

Figure 3B:
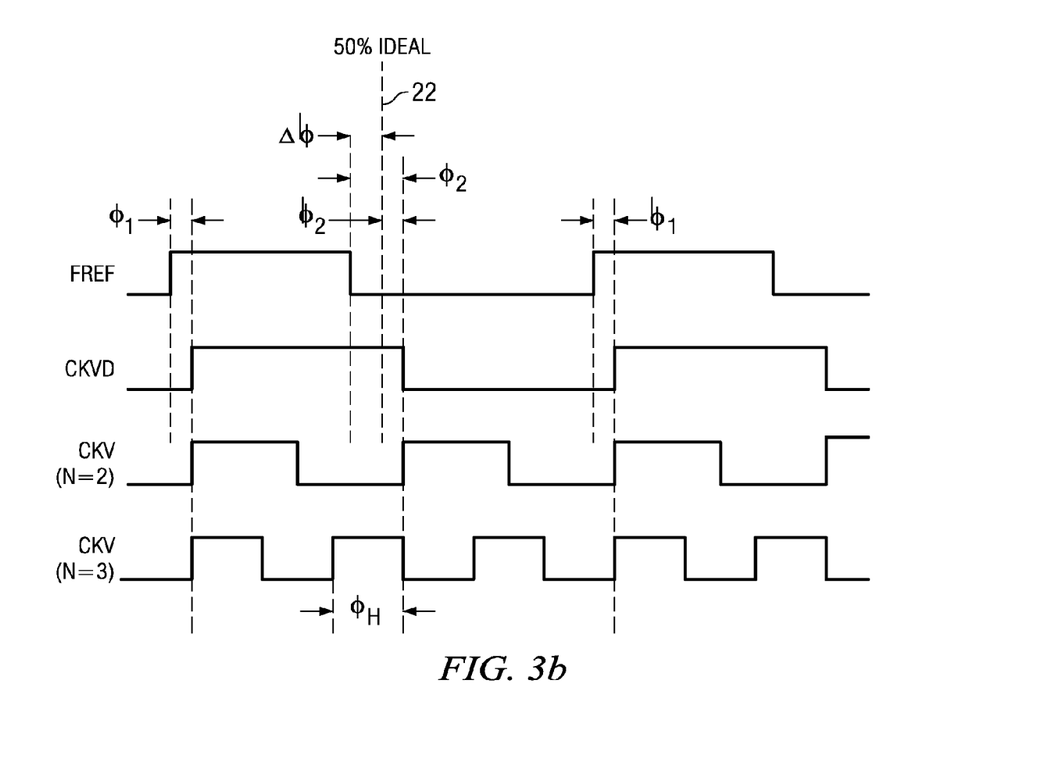

FIG. 3b illustrates a timing diagram showing FREF, CKVD and two examples of CKV (for N=2 and N=3). As can be seen in FIG. 3b, when phase detectors compare FREF and CKVD as shown in FIG. 3a, phase detector 32 compares the rising edge of FREF with the rising edge of CKVD and phase detector 34 compares the falling edge of FREF (or the rising edge of the inverted FREF) with the falling edge of CKVD (or the rising edge of the inverted CKVD). $\Delta\phi$ is the phase difference between the actual falling edge of FREF and the ideal 50% duty cycle falling edge. For a rising edge, $\phi_E$, the output of multiplexer 38, equals $\phi_1$ and, for a falling edge, $\phi_E$ equals $\phi_2$, which equals $\phi_2'+\Delta\phi$.

It would also be possible to compare the edges of FREF with the output CKV. In this case, both the rising edge and falling edge of FREF would be compared to a rising edge of CKV, if N ($f_{CKV}/f_{FREF}$) was an even integer. If N is an odd integer, two approaches could be used. In the first approach, rising edges of FREF would be compared to rising edges of CKV and falling edges of FREF would be compared to falling edges of CKV (it would also be possible to compare rising edges of FREF to falling edges of CKV and vice-versa). In the second embodiment, a half-phase adjustment $\phi_H$ could be added to $\phi_2$' along with $\Delta\phi$ by the phase offset adder 36, such that $\phi_2 = \phi_2' + \Delta\phi + \phi_H$.

Figure 4A:
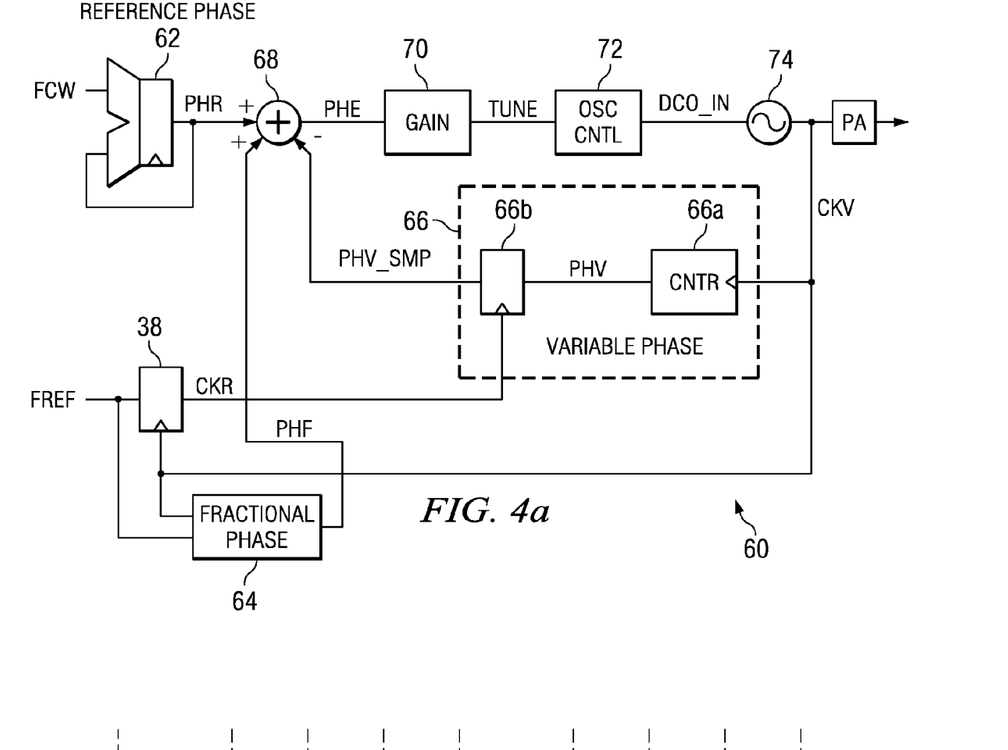
FIG. 4a illustrates a block diagram of an all digital phase locked loop (ADPLL)

FIG. 4a illustrates a block diagram of an all digital PLL (ADPLL) 60 of the type disclosed in U.S. Ser. No. 10/008, 462, now U.S. Pat. No. 7,006,589, to Staszewski et al, entitled "Frequency Synthesizer with Phase Restart", filed Nov. 30, 2001, which is incorporated by reference herein. This ADPLL is designed to work off a single edge of FREF.

ADPLL 60 includes a reference phase accumulator 62 that calculates a reference phase signal (PHR), a fractional error correction circuit 64 that calculates a fractional error correction (PHF), and a variable phase accumulator 66 that calculates a variable phase correction (PHV_SMP, which is integer only). The phase error (PHE) is calculated by phase detector 68 as PHE=PHR+PHF-PHV_SMP (with proper bit alignment to line up integer and fractional portions). PHE is received by gain circuit 70 and oscillator control circuit 72. The oscillator control circuit 72 drives a digitally controlled oscillator 74.

FCW (frequency control word) is the ratio of the desired frequency of CKV divided by the frequency of FREF. The reference phase signal is an accumulation of FCW at the active edge of CKR, which is the retimed FREF clock. The FCW input to the reference accumulator 62 is used to establish the operating reference phase of the desired channel plus the modulation data.

The variable phase accumulator 66 comprises a counter 66a, which increments on each active edge of CKV and a latch 66b that latches the output of the counter at CKR.

The fractional phase circuit 64 determines a difference between an active edge of FREF and the next active edge of CKV, normalized to a fraction of a CKV clock cycle.

Figure 4B:
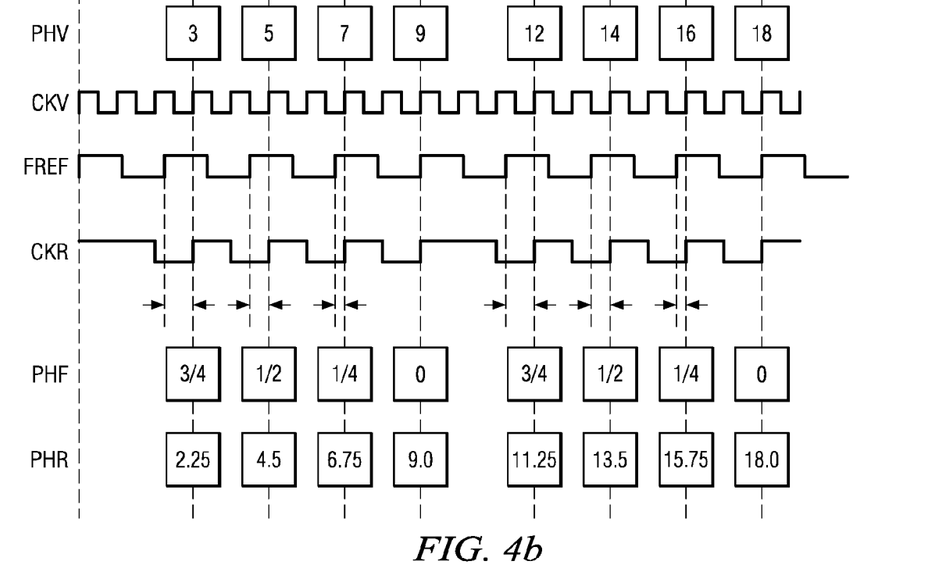

Operation of the circuit is best understood in relation to the timing diagram of FIG. 4b, where an example of FCW=2.25 is used. In an actual circuit, however, FCW would typically be much higher. For purposes of illustration, FCW is a constant (i.e., no modulation) and there is no drift. As described above, the variable phase circuit 66 counts the CKV clocks and latches the count on the active (rising) edge of CKR. The PHV from the variable phase circuit 66 counts are provided above the CKV signal. Also at each active edge of CKR, the reference phase circuit 62 accumulates another FCW.

At any active edge of CKR, the preceding active edge of FREF may have occurred at a point less than one CKV clock cycle earlier (since CKR is retimed to CKV). This is shown by the dashed lines in FIG. 4b. PHF measures this fractional part of a CKV cycle. As can be seen in FIG. 4b, for the steady state situation, without drift or modulation, the addition of PHF and PHR will equal PHV and PHE will be zero.

Figure 5:
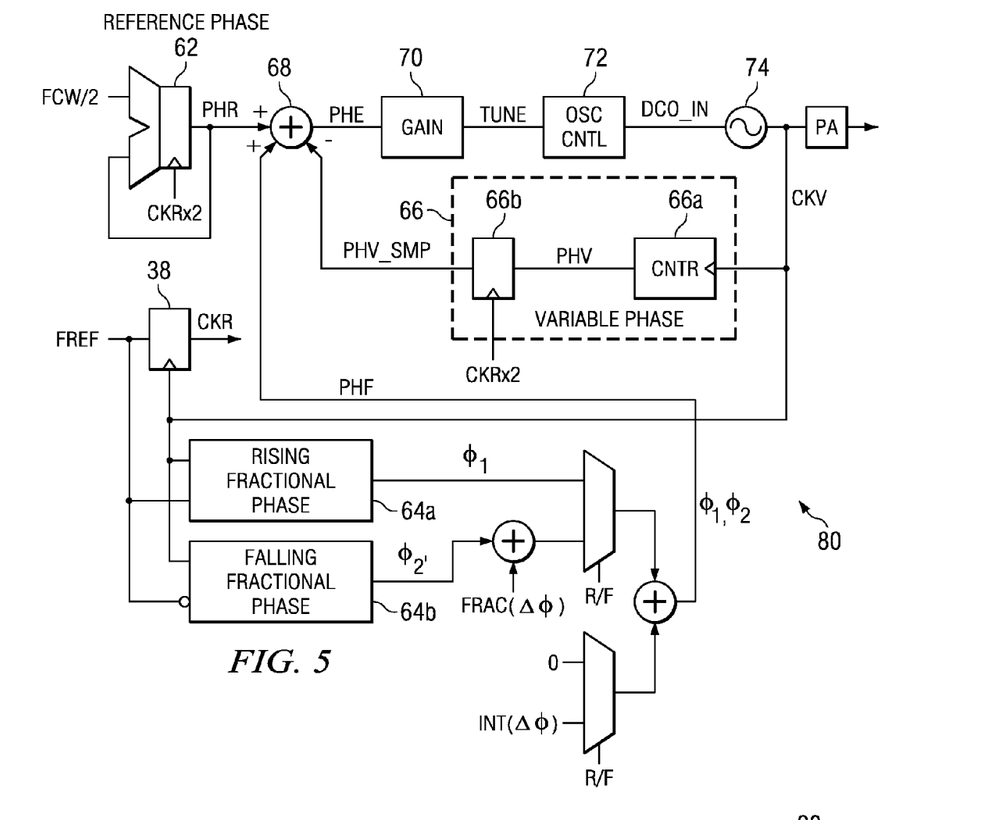
FIG. 5 illustrates an ADPLL using the both edges of the reference clock to double the sampling rate of the PLL operation.

FIG. 5 illustrates a block diagram of an ADPLL 80 designed to work off both falling and rising edges of FREF. In this embodiment, the control word FCW from FIG. 4a is halved, since it will be accumulated twice per FREF clock cycle (as shown by the retimed signal CKR×2, which is at twice the CKR frequency). The variable phase circuit 66 is also sampled twice per FREF cycle. The fractional phase errors are computed using a rising fractional phase circuit 64a and a falling fractional phase circuit 64b. The rising fractional phase circuit determines a phase error on the rising edge of FREF and the falling fractional phase circuit determines an intermediate phase error on the falling edge of FREF. On the rising edge of FREF, the output of the rising fractional phase error circuit 64a is passed to adder 68 for the determination of PHE, similar to that described in connection with FIGS. 4a-b. On the falling edge of FREF, the intermediate phase error $\phi_2$' is added to the fractional portion of the offset error $\Delta\phi$ (which could be greater than one). The sum is then added to the integer portion of the offset error $\Delta\phi$ to provide $\phi_2$. This sum is passed to adder 68 for the computation of PHE. Alternatively, $\Delta\phi$ could be added to $\phi_2$', so long as the fractional part of $\Delta\phi$ is not compromised by a large value of $\Delta\phi$.

Figure 6:
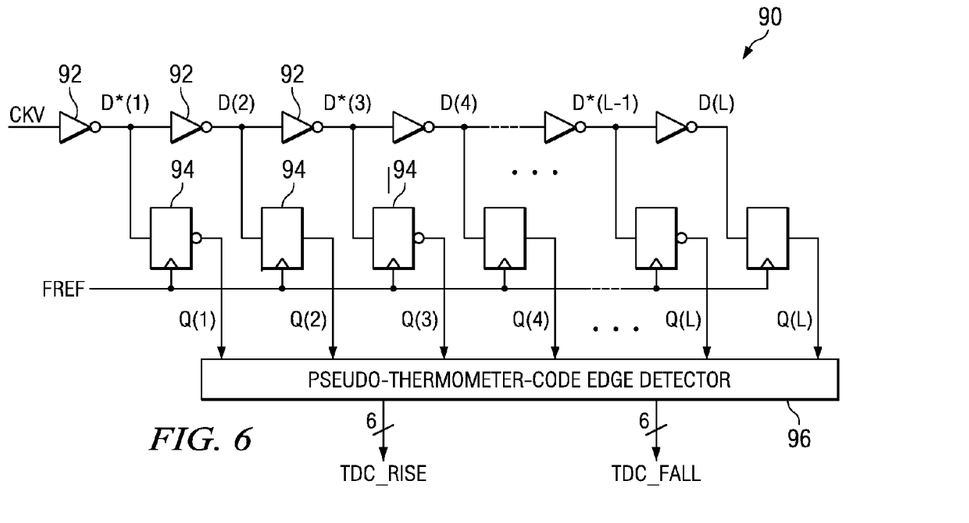
FIG. 6 illustrates a schematic diagram of a time-to-digital converter.

FIG. 6 illustrates a time-to-digital converter (TDC) 90 for measuring a fractional delay between CKV and FREF. Such a circuit may be used as the rising or falling fractional phase circuits 64a and 64b. The CKV signal passes through a string of inverters 92. Each inverter (or other logic device) 92 features a known time delay, for example, approximately 20 psec using Texas Instruments' (C035) of 0.08 m L-effective CMOS process. On the active (rising) edge of FREF, a corresponding set of registers 94 capture the timing state output (D(1) . . . D(L)) of each inverter. The output of every other register 94 is inverted to compensate for the inversion by each inverter 92. The outputs (Q(1) . . . , Q(L)) of the registers 94 are received by a pseudo-thermometer-code edge detector 96, which outputs the location of a rising edge and a falling edge relative to FREF.

Figure 7:
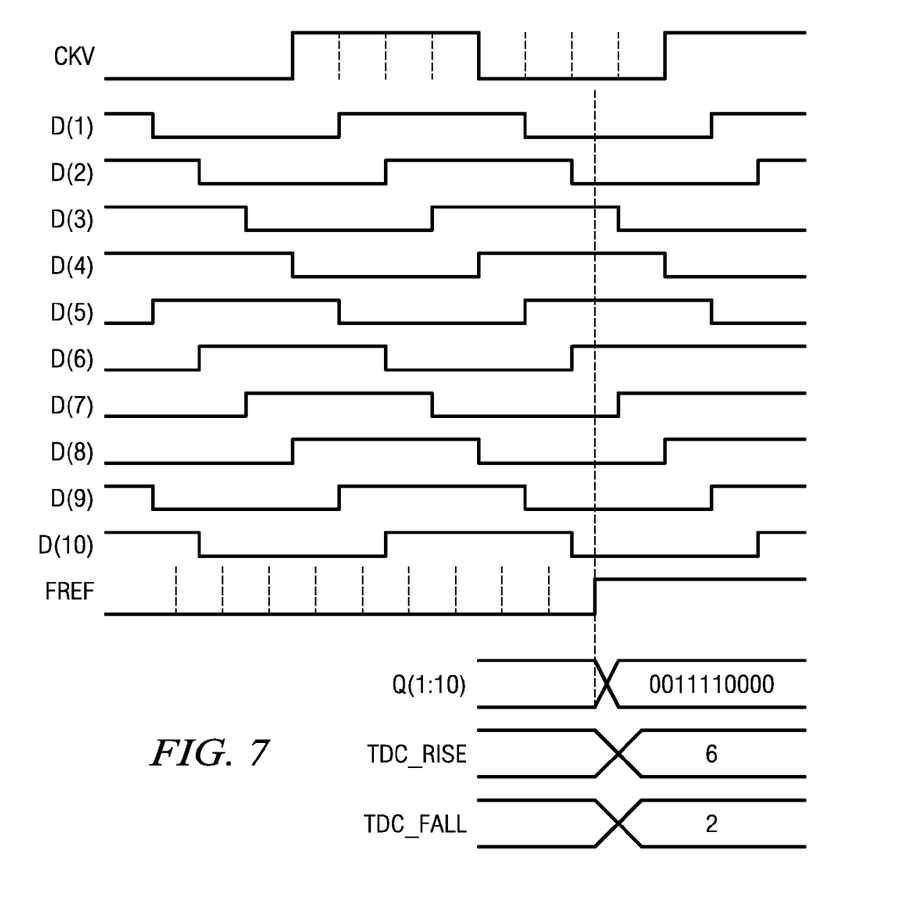
FIG. 7 illustrates a timing diagram showing the operation of the time-to-digital converter of FIG. 6.

The operation of the circuit is shown in FIG. 7, which shows the Q(1 . . . L) values (L=10 in the illustrated embodiment) at the active edge of FREF. In the illustrated example, the falling edge of CKV that immediately precedes FREF is displaced by two inverter delays, while the rising edge of CKV that immediately precedes FREF is displaced by six inverter delays.

While FIG. 5 shows two fractional phase detectors 64a and 64b, the functions of the two devices could be combined into a single circuit that shares hardware, such as the string of inverters 92 and the psuedo-thermometer code edge detector 96.

Additional detail on the operation of time-to-digital converter 90 can be found in U.S. Ser. No. 09/608,317, now U.S. Pat. No. 6,429,693, filed Jun. 30, 2000, entitled "Digital Fractional Phase Detector" to Staszewski et al and in U.S. Ser. No. 09/967,275, now U.S. Pat. No. 6,593,773, filed Sep. 28, 2001, entitled "Power Saving Circuitry Using Predictive Logic" to Staszewski et al, both of which are incorporated by reference herein.

Figure 8:
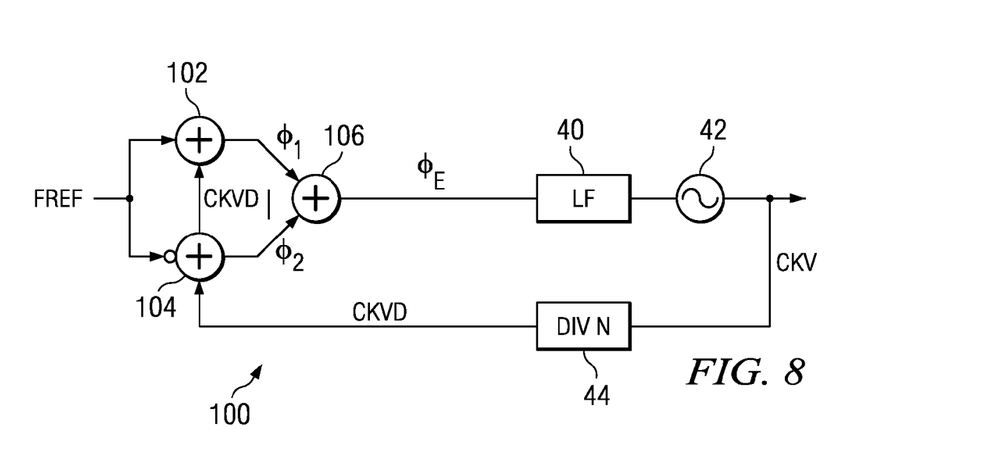
FIG. 8 illustrates a second embodiment of a PLL sampling on both edges of the reference clock.

FIG. 8 illustrates a block diagram of a second embodiment of a PLL 100 that can use both edges of a reference clock. In this embodiment, FREF is coupled to phase detector 102 (which is responsive to a first active edge of FREF, e.g., the rising edge of FREF) and to phase detector 104 (which is responsive to a second active edge of FREF, e.g., the falling edge of FREF). The output of phase detector 102 is $\phi_1$ and the output of phase detector 104 is $\phi_2$. It is assumed that the phase detectors 102 and 104 hold the output until the next compare event. The two most recent values of $\phi_1$ and $\phi_2$ are added by adder 106. The output of adder 106 is $\phi_E$. $\phi_E$ is passed to the loop filter 40 and to the controllable oscillator 42. The output of controllable oscillator 42 is fed back to the phase detectors 102 and 104.

In operation, the controllable oscillator 42 updates the signal twice per FREF clock cycle, driven by the average of the sum of the most recent outputs of the phase detectors as shown by Table 1. As in the case of FIG. 4a, it is assumed that phase detector 102 compares the rising edge of FREF with the rising edge of CKVD and phase detector 104 compares the falling edge of FREF with the falling edge of CKVD. It would also be possible to compare the edges of FREF with the output CKV. In this case, both the rising edge and falling edge of FREF could be compared to a rising edge of CKV, if N ($f_{CKV}/f_{FREF}$) was an even integer. If N is an odd integer, rising edges of FREF could be compared to rising edges of CKV and falling edges of FREF would be compared to falling edges of CKV (it would also be possible to compare rising edges of FREF to falling edges of CKV and vice-versa). Another possibility would b to add an offset $\phi_H$, as described above.

TABLE 1

PHASE ERROR CALCULATION

| Clock cycle | $\phi_E$ |
|---|---|
| n (rising) | $\phi_1(n) + \phi_2(n - 1)$ |
| n (falling) | $\phi_1(n) + \phi_2(n)$ |
| n + 1 (rising) | $\phi_1(n + 1) + \phi_2(n)$ |
| n + 1 (falling) | $\phi_1(n + 1) + \phi_2(n + 1)$ |
| n + 2 (rising) | $\phi_1(n + 2) + \phi_2(n + 1)$ |
| n + 2 (falling) | $\phi_1(n + 2) + \phi_2(n + 2)$ |

Figure 9:
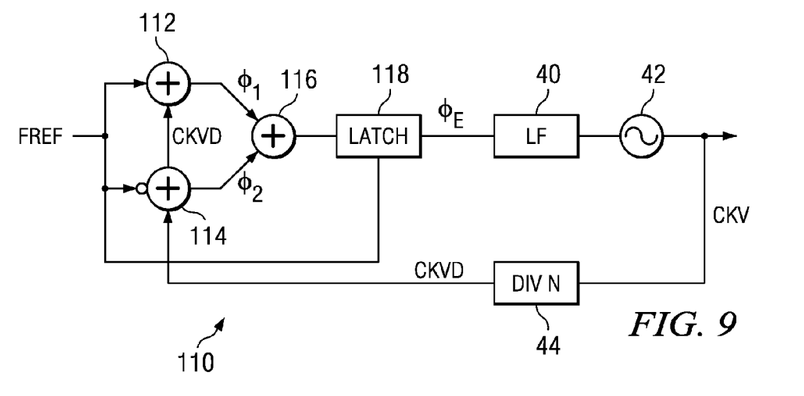
FIG. 9 illustrates a third embodiment of a PLL sampling on both edges of the reference clock.

FIG. 9 shows a block diagram of a single sampling PLL 110 that calculates a phase error based on detections on both edges of FREF. In this embodiment, FREF is coupled to phase detector 112 and an inverted FREF is coupled to phase detector 114. The output of phase detector 112 is $\phi_1$ and the output of phase detector 114 is $\phi_2$. The two most recent values of $\phi_1$ and $\phi_2$ are added by adder 116, but the total is latched by latch 118 only on a single edge of FREF (the rising edge in the illustrated embodiment). The output of latch 118 is $\phi_E$. $\phi_E$ is passed to the loop filter 40 and to the controllable oscillator 42. The output of controllable oscillator 42 is fed back to the phase detectors 112 and 114.

TABLE 2

PHASE ERROR CALCULATION

| Clock cycle | $\phi_E$ |
|---|---|
| n (rising) | $\phi_1(n) + \phi_2(n - 1)$ |
| n + 1 (rising) | $\phi_1(n + 1) + \phi_2(n)$ |
| n + 2 (rising) | $\phi_1(n + 2) + \phi_2(n + 1)$ |

This embodiment differs from the embodiment of FIG. 8 in that the phase error driving the controllable oscillator 42 is updated only once per FREF cycle, although phase error contains components of updates performed twice during the FREF signal.

Figure 10:
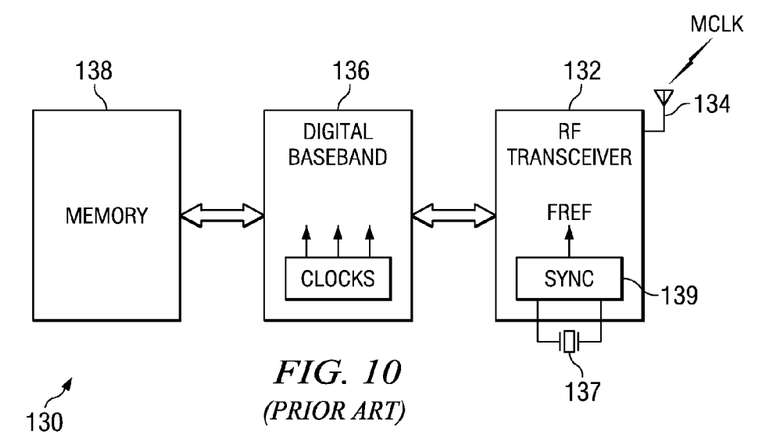
FIG. 10 illustrates a general block diagram of a prior art mobile communication device.

FIG. 10 illustrates a block diagram of a general mobile phone architecture 130. An RF transceiver 132 is coupled to an antenna 134 and a digital baseband circuit 136. The digital baseband circuit 136 is coupled to a memory subsystem 138. In operation, the digital baseband circuitry 136, which can include one or more digital signal processors (DSPs) and general purpose processors, generates the data for transmission over the RF transceiver. As described above, the RF transceiver uses a highly stable FREF signal, typically from a crystal oscillator. An external crystal 137 is coupled to a sync circuit 139 (controlled in software by the digital baseband 136) that matches the frequency and phase of the crystal (possibly through a PLL) with a master clock (MCLK), which is embedded in communication data and broadcast to the mobile device 130 by the base stations. In turn, the base stations synchronize their master clock with an even more precise clock signal, such as from a cesium clock, which may be received by the base stations via fiber or satellite communications. The synchronization circuitry 139 can be very complex.

Additionally, there may be several clocks in the digital baseband circuit 136 that run independently of the clocks in the RF transceiver 132. This can cause significant noise, especially if the RF transceiver circuit were to be fabricated on the same circuit as the digital baseband circuit.

Figure 11:
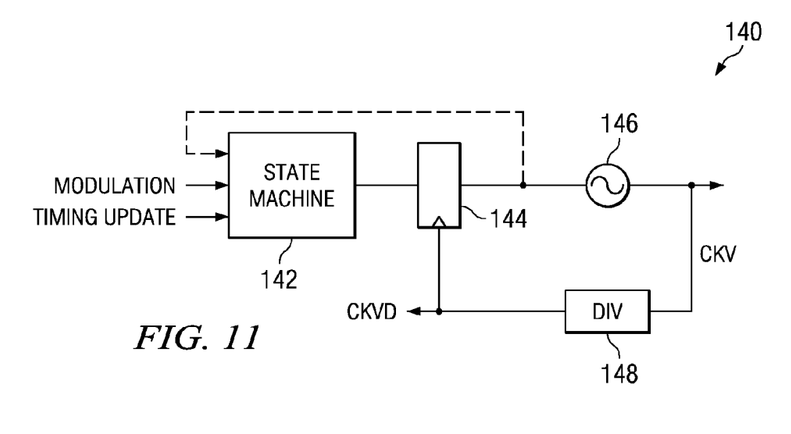
FIG. 11 illustrates a general block diagram of circuitry for providing a PLL function using a divided clock from the DCO as a synchronous clock for the RF transceiver and digital baseband circuit.

FIG. 11 illustrates a general block diagram of an architecture for the RF portion of a mobile communications device 140 which has significant advantages over the prior art. A state machine 142 receives modulation and controllable oscillator timing update information (along with optional feedback). State machine information is stored in latch 144, which is clocked at CKVD (a divided clock signal derived from the output CKV). The output of latch 144 is coupled to the digitally controlled oscillator (DCO) 146. The output of DCO 146 is coupled to frequency divider 148. The output of frequency divider 148 is CKVD.

In operation, the CKV signal is may be divided down by several frequency dividers 148 to provide suitable clock signals for devices in both the RF transceiver 132 and the digital baseband circuitry 136. For example, by generating a CKV having a frequency of 2.4 GHz, the signal could be divided to a clock of about 8 MHz for generating data samples for a Bluetooth application and could be divided to a clock of about 100 MHz for generating samples in an 802.11b application. Other divided clock frequencies could be used for purposes other than the data symbol generation. Preferably, the frequency dividers divide by a power of two.

Figure 12:
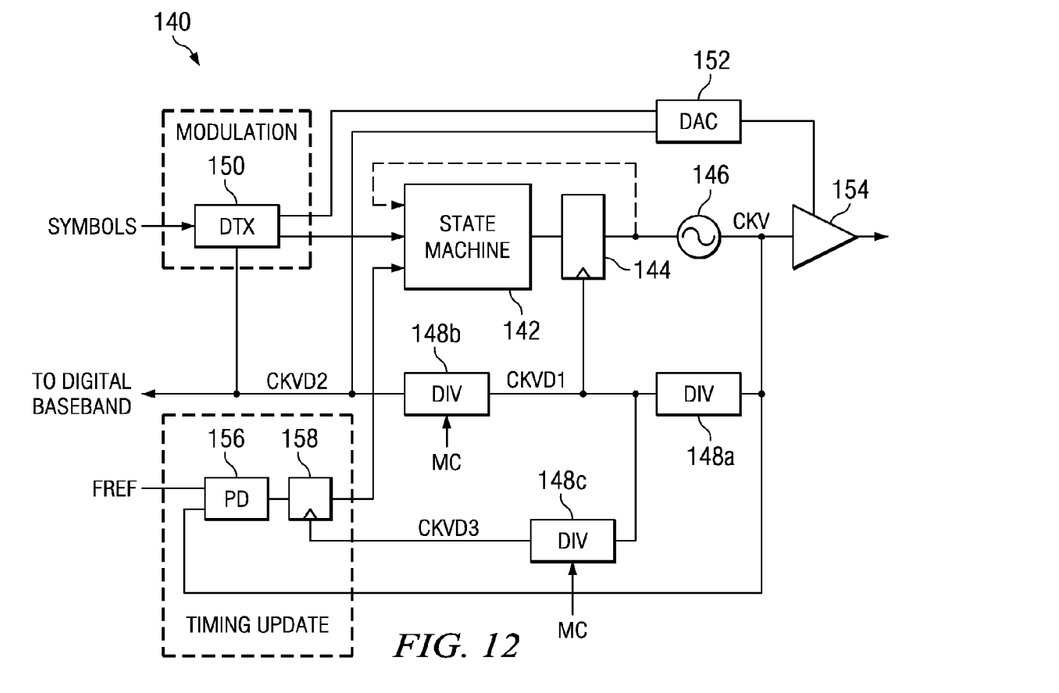
FIG. 12 illustrates a more detailed block diagram for a first embodiment of the circuit of FIG. 11.

FIG. 12 illustrates a more detailed block diagram of a first embodiment of the RF portion of the mobile communication device 140. In this embodiment, symbols from the digital baseband circuitry 136 (see FIG. 10) are received by data transmit modulation circuit 150. Data from the data transmit modulation circuit 150 is output to state machine 142 and to digital-to-analog converter (DAC) 152, if amplitude modulation is being used. The output of DAC 152 drives power amplifier 154, which is coupled to the output (CKV) of DCO 146. CKV is also output to frequency divider 148a, as well as to phase detector 156. The output of frequency divider 148a (CKVD1) is coupled to frequency dividers 148b and 148c, which output signals CKVD2 and CKVD3, respectively. CKVD2 clocks DAC 152 and is also output to the data transmit modulation circuit 150 and to digital baseband circuitry 136. CKVD3 clocks latch 158 at the output of phase detector 156. The output of latch 158 is coupled to state machine 142.

In operation, the data modulation circuit creates sample points based on the symbols received from the digital baseband circuit 136. In the prior art, a "chip clock" is used to generate these samples at a desired frequency. In general, the chip clock is a multiple of the reference clock and requires a clock generation circuitry, such as a PLL to generate a higher frequency clock from the reference clock. In the illustrated embodiment, however, a clock derived from the output of the DCO 146 (i.e., CKVD2) is used for the chip clock, by dividing the output of the DCO. A data modulation circuit of this type is disclosed in U.S. Ser. No. 10/001,448 to Staszewski et al, entitled "Transmit Filter", filed Oct. 31, 2001, which is incorporated by reference herein. An apparent data rate can be adjusted by dynamically changing the oversampling ratio of the transmit filter.

Any number of clock frequencies could be generated from CKV. These clocks could be used in the various parts of a device, in particular in the digital baseband circuit 136 and throughout the RF transceiver 132, eliminating multiple clock generation circuits. Additionally, using clocks generated from CKV in both the baseband circuit 136 and in the RF transceiver 132 provides many significant advantages. For example, since the clocks in the two subsystems are interrelated, operations occurring in the digital baseband circuit 136 could be timed to cause the least possible spurious noise in the RF transceiver 132.

Figure 13:
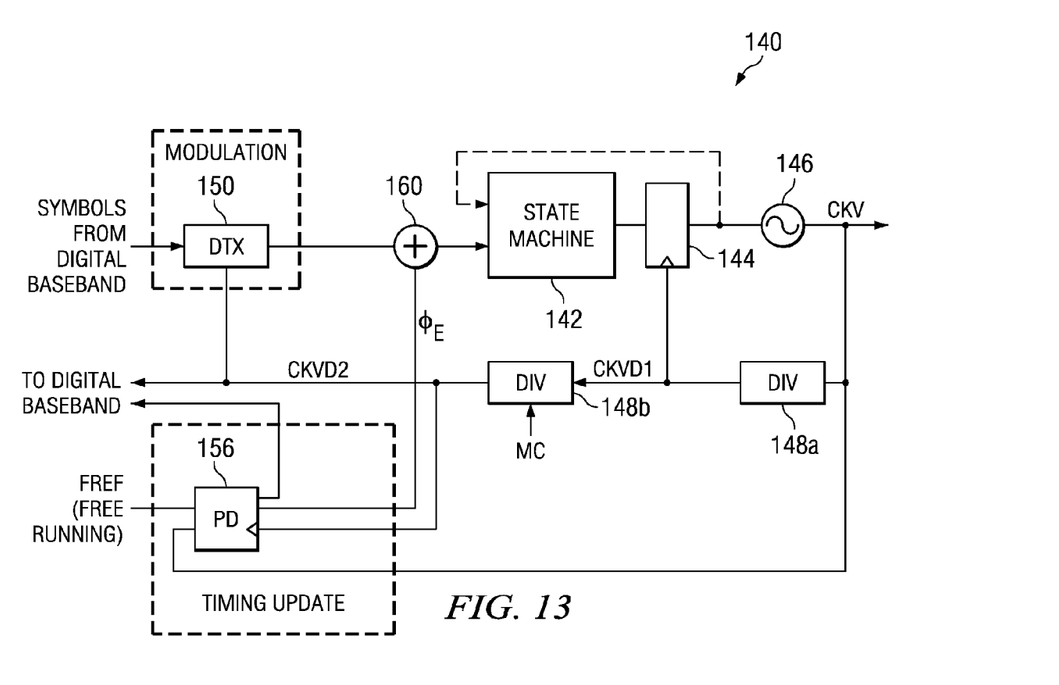
FIG. 13 illustrates a more detailed block diagram for a second embodiment of the circuit of FIG. 11.

FIG. 13 illustrates a second embodiment, similar to that of FIG. 12, where a single clock CKVD2 is used for both timing updates through the phase detector 156 and for data modulation through data transmit modulation circuit 150. In this embodiment, $\phi_E$ is generated by the phase detector 156 and passed to adder 160 such that a single number for data modulation and timing updates is passed to state machine 142.

A value A, an integer indicating a relative position of the CKVD2 clock to the free-running FREF frequency reference, is passed back to the digital baseband circuit 136 where it may be used for synchronization, framing, timing adjustment of the fractional rate of the modulating data, and phase/frequency adjustment of the synthesized RF frequency with MCLK. FREF can now operate in a free-running mode (i.e., not adjusted by MCLK). The master clock MCLK synchronization circuit would now perform adjustment of the center frequency of the RF oscillator, rather than adjust FREF. Adjustments to the center frequency can be made by adjustments to $\phi_E$. Since FREF is a very stable clock and since MCLK updates are infrequent, adjustments are very small and occur over long periods of time.

In FIGS. 12 and 13, the phase detection circuits are clocked by a signal that is a division of CKV. Instead of using CKR, which is the FREF clock retimed to CKV clock (see FIG. 5), as the system clock, a power-of-two division (or any other division) of CKV could be used as the system clock. Comparison events in the phase detector would be triggered by the FREF clock in which the clock timing delay is obtained by time-to-digital converters (see FIG. 6) and the result used to perform phase value adjustment.

As can be seen in FIGS. 12 and 13, some or all of the frequency dividers 148 are controlled by a modulus control (MC) signal. This signal is used to indicate a divisor. For example, for a divide-by-8/9 frequency divider, MC=8/9. MC could vary dynamically during operation of the device in order to obtain a fractional division ratio.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

The invention claimed is:

1. A phase locked loop circuit comprising:
(A) oscillator circuitry having an input and an output;
(B) a reference frequency lead carrying a clock signal having regularly spaced and alternating rising and falling edges;
(C) a first phase detection circuit having a first input coupled to the reference frequency lead, a second input coupled to the output of the oscillator circuitry, and an output coupled to the input of the oscillator circuitry, the first phase detection circuit being responsive to the rising edges;
(D) a second phase detection circuit having a first input coupled to the reference frequency lead, a second input coupled to the output of the oscillator circuitry, and an output, the second phase detection circuit being responsive to the falling edges;
(E) phase offset adder circuitry having a first input coupled to the output of the second phase detection circuit, a second input coupled to an offset constant, and an output coupled to the input of the oscillator circuitry; and
(F) multiplexer circuitry having a first input coupled to the output of the first phase detection circuit, a second input coupled to the output of the phase offset adder, a control input, and an output coupled to the input of the oscillator circuitry.

2. The circuit of claim 1 including loop filter circuitry having an input coupled to the output of the multiplexer circuitry and an output coupled to the input of the oscillator circuitry.

3. The circuit of claim 1 in which the reference frequency lead carries the clock signal having the regularly spaced and alternating rising and falling edges with approximately a 50% duty cycle and the offset constant being the amount the edges are offset from an ideal 50% duty cycle.

4. A phase locked loop circuit comprising:
(A) a reference frequency lead;
(B) a first phase detection circuit having a first input coupled to the reference frequency lead, a second input and an output;
(C) a second phase detection circuit having a first input coupled to the reference frequency lead, a second input and an output;
(D) a phase offset adder having a first input coupled to the output of the second phase detection circuit, a second input coupled to an offset constant, and an output;
(E) multiplexer circuitry having a first input coupled to the output of the first phase detection circuit, a second input coupled to the output of the phase offset adder, a control input, and an output;
(F) loop filter circuitry having an input coupled to the output of the multiplexer circuitry and an output;
(G) oscillator circuitry having an input coupled to the output of the loop filter circuitry and having an output; and
(H) frequency divider circuitry having an input coupled to the output of the oscillator circuitry and an output coupled to the second input of the first phase detection circuit and to the second input of the second phase detection circuit.

5. The circuit of claim 4 including an inverter coupling the reference frequency lead to the second phase detection circuit.

6. The circuit of claim 4 in which the reference frequency lead carries a clock signal having regularly spaced and alternating rising and falling edges with approximately a 50% duty cycle and the offset constant being the amount the edges are offset from an ideal 50% duty cycle.

* * * * *